United States Patent [19]

Onodera et al.

[11] Patent Number: 5,754,047
[45] Date of Patent: May 19, 1998

[54] INSPECTION METHOD AND APPARATUS USING NUCLEAR MAGNETIC RESONANCE

[75] Inventors: Yukari Onodera, Asaka; Etsuji Yamamoto, Akishima; Hiroyuki Itagaki, Kokubunji; Yo Taniguchi, Hachioji, all of Japan

[73] Assignee: Hitachi Medical Corporation, Tokyo, Japan

[21] Appl. No.: 778,251

[22] Filed: Jan. 8, 1997

Related U.S. Application Data

[63] Continuation of Ser. No. 422,234, Apr. 14, 1995, Pat. No. 5,602,480.

[30] Foreign Application Priority Data

| Apr. 19, 1994 | [JP] | Japan | 6-080175 |
| Apr. 21, 1994 | [JP] | Japan | 6-083062 |

[51] Int. Cl.⁶ ................................ G01V 3/00
[52] U.S. Cl. ................................ 324/320; 324/309
[58] Field of Search ................... 324/320, 309, 324/318, 322, 307, 319; 128/653.2

[56] References Cited

U.S. PATENT DOCUMENTS

| 4,652,826 | 3/1987 | Yamamoto et al. | 324/320 |
| 4,700,136 | 10/1987 | Yamaguchi et al. | 324/320 |
| 5,121,060 | 6/1992 | Doddrell et al. | 324/320 |
| 5,602,480 | 2/1997 | Onodera et al. | 324/320 |

*Primary Examiner*—Louis M. Arana
*Attorney, Agent, or Firm*—Antonelli, Terry, Stout, & Kraus, LLP

[57] ABSTRACT

An inspection method by means of an inspection apparatus using nuclear magnetic resonance and having magnetic field generating apparatus for generating a static magnetic field, gradient magnetic fields and an RF magnetic field; magnetic field generating apparatus by means of additional shim coils, which vary homogeneity of the static magnetic field by varying current flowing therethrough; signal detecting apparatus for detecting nuclear magnetic resonance signals from an object to be inspected; an apparatus for processing signals detected by the signal detecting apparatus; and control apparatus for controlling currents flowing through the shim coils, which method using nuclear magnetic resonance comprises a step of storing shim currents corresponding to each of a plurality of slices, capable of improving homogeneity of the static magnetic field for each of the plurality of slices, and a step of switching over the shim currents to those corresponding to a relevant slice to be measured prior to measurements of nuclear magnetic resonance signals from the slice. This inspection method can be applied also to a case where measurements of other slices are effected in intervals of measurements of the relevant slice.

2 Claims, 13 Drawing Sheets

INSPECTION METHOD AND APPARATUS USING NUCLEAR MAGNETIC RESONANCE

This application is a Continuation of application Ser. No. 08/422,234, filed Apr. 14, 1995 now U.S. Pat. No. 5,602, 480.

BACKGROUND OF THE INVENTION

The present invention relates to a measurement method with three-dimensional images using nuclear magnetic resonance (hereinbelow abbreviated to NMR), and in particular to an inspection method suitable for measuring simultaneously three-dimensional images of a plurality of regions.

A magnetic resonance imaging apparatus is one for obtaining tomographic images using nuclear magnetic resonance phenomena. Usually measurement is effected with two-dimensional images of a specified slice. However, in case where images of a large area are required, two-dimensional multi-slice images or three-dimensional images are used for measurement. In a measurement with two-dimensional multi-slice images magnetic resonance (NMR) signals from a plurality of slices are measured during a waiting time for magnetization recovery and a plurality of two-dimensional images can be obtained in a measurement time for one two-dimensional image. By this method, since a region constituting one image is in accordance with a region where spin should be excited, S/N decreases which decreases slice thickness. In addition, since it is feared that substantial excitation regions overlap on each other, no measurement can be effected in a gapless manner.

On the contrary, for three-dimensional images, a large region is excited and a plurality of tomographic images can be obtained by phase encoding. For this reason, signal measurement efficiency is high, S/N doesn't decrease remarkably, even if slices are thin, and measurement can be effected in a gapless manner.

The principle of the magnetic resonance imaging explained above is described in detail in "MRI diagnostic (basis and clinic)", Asakura bookseller's, pp. 69–78 (1988). A drawback of the three-dimensional measurement is that measurement time is long, because the number of repetitions increases.

However it is possible to shorten the measurement time by applying an ultra fast imaging method such as the echo-planar method, etc., described in Journal of Magnetic Resonance, 29, pp. 355–373 (1978), to the three-dimensional image measurement.

FIG. 2 is a pulse sequence diagram in case where the conventional echo-planar method is applied to the three-dimensional image measurement. In FIG. 2 the abscissa represents the time and the ordinate represents the intensity of RF pulses, gradient magnetic fields, etc. Further reference numeral 1 is an excitation RF pulse; 2 is a slicing gradient magnetic field applied in a first direction; 3 is a phase encoding gradient magnetic field applied in the first direction; 4 is a phase encoding gradient magnetic field applied in a second direction; 5 is a readout gradient magnetic field applied in the third direction; and 6 is a nuclear magnetic resonance signal.

The excitation RF pulse 1 is applied to an object to be inspected at the same time as the slicing gradient magnetic field 2 to excite a specified region. Spatial information in the first direction is given to the nuclear magnetic resonance signal 6 by applying subsequently thereto the phase encoding gradient magnetic field 3 in the first direction.

Then the nuclear magnetic resonance signal 6 is read out by applying thereto the readout gradient magnetic field 5 at the same time as the phase encoding gradient magnetic field 4. The nuclear magnetic resonance signal 6 consists of a plurality of echo signals, each of which has a peak, when the integral of the readout gradient magnetic field 5 is zero.

At this time, since each of the echos includes spatial information in the direction, in which the readout gradient magnetic field 5 is applied, and further applied magnitude of the phase encoding gradient magnetic field 4 differs for different echos, a plurality of echos including different spatial information for the application direction of the phase encoding gradient magnetic field 4 are measured.

The above procedure is repeated while varying applied magnitude of the phase encoding gradient magnetic field 3 and a three-dimensional image is obtained by subjecting the measured nuclear magnetic resonance signal to three-dimensional Fourier transformation.

In the ultra fast imaging method, spectroscopic imaging, etc., inhomogeneity of a static magnetic field below about several ppm, which is so small that it gives rise to no problem for usual imaging, lowers significantly S/N or spectroscopic resolution. Therefore it is desirable to effect a processing to improve homogeneity of the static magnetic field prior to these imagings. However, since static magnetic field distribution is distorted by characteristics of the magnet itself, influences of magnetic substances in the neighborhood, susceptibility distribution of an object to be examined itself, etc., the processing is generally not easy.

Usually a multi-channel coil system called shim coil is incorporated in a magnet for generating the static magnetic field in order to correct this inhomogeneity of the static magnetic field. The homogeneity of the static magnetic field in a region to be imaged is improved by superposing shim magnetic fields having various characteristics generated by this multi-channel coil system on the static magnetic field generated by the static magnetic field coil.

However, since shim coils can generate at most only magnetic fields of about third order, it is not possible to correct completely higher order distortion in the magnetic field due to the shape of a living body all, etc. over the whole magnet.

Therefore, heretofore, as described e.g. in Magnetic Resonance in Medicine, 18, pp. 335–347 (1991), regulation of the static magnetic field is effected so that distribution of the static magnetic field is uniform only in a region used for the imaging.

For example, when two slices distant by 8 cm from each other are imaged by multi-slice imaging, as indicated in FIG. 3, a set of shim currents are determined so that the homogeneity of the static magnetic field all over the region including the two slices is best and shim magnetic fields are generated according to these shim currents prior to the multi-slice imaging (Step 100). Thereafter different slices are imaged without varying the distribution of the magnetic field (Steps 200 and 300).

SUMMARY OF THE INVENTION

By the above prior art techniques it is possible to intend to shorten measurement time by applying a fast imaging method such as the echo planar method, etc. to three-dimensional imaging measurement and in case where an location of interest has a large area, the three-dimensional imaging measurement is suitable. However, in case where there exist a plurality of locations of interest, when the prior art three-dimensional imaging measurement is effected, it is necessary to measure a region including all the locations of interest or to effect measurement by dividing it into several parts. Therefore there was a problem that measurement time was increased.

A first object of the present invention is to provide an inspection method using nuclear magnetic resonance, which can remove such a problematical point, capable of obtaining three-dimensional images of a plurality of locations of interest without elongating measurement time.

Further, as described previously, it is easy to correct high order distortions of the magnetic field by using low order shim magnetic fields, if a region where homogeneity of the static magnetic field is to be improved is restricted to a narrow region, while it becomes more difficult to obtain distribution of high homogeneity of the static magnetic field with increasing area of the region. Consequently, there was a problem that, by the multi-slice imaging, as described above, imaging should be effected under a condition of lower homogeneity of static magnetic field as that used by single slice imaging and that image quality is naturally worsened. Similarly, in case where spectroscopic measurements are effected for a plurality of local regions, this gives rise to a problem such as worsening in spectroscopic resolution, etc. with respect to a case where the spectroscopic measurement is effected for a single local region.

A second object of the present invention is to provide an inspection method and an apparatus using NMR, which can solve the problems of the prior art techniques and which is suitable for multi-slice imaging or spectroscopic measurements of local regions, capable of improving the homogeneity of the static magnetic field.

The first object of the present invention is an inspection method for an inspection apparatus using NMR comprising means for generating a static magnetic field, gradient magnetic fields and an RF magnetic field; magnetic field generating means by additional shim coils, which vary homogeneity of the static magnetic field by varying current flowing therethrough; signal detecting means for detecting NMR signals from an object to be inspected; means for processing signals detected by the signal detecting means; and means for controlling currents flowing through the shim coils (shim currents), which is a method for multi-slice measurements with the help of three-dimensional images of a plurality of local regions by the echo-planar method, the fast SE method, the CPMG (Carr—Parcell—Meiboom—Gill) method, etc., dividing the whole region to be measured in the three-dimensional images into different locations of interest.

This three-dimensional multi-slice measurement is characterized in that nuclear magnetic resonance signals from different slices are measured during waiting time of magnetization recovery. For example, when applied to the echo-planar method, it comprises a first step of applying the first slicing gradient magnetic field (28 in FIG. 1) in the first direction and the first excitation pulse (27 in FIG. 1) simultaneously to the object to be inspected; a second step of applying thereto the first phase encoding gradient magnetic field A (29 in FIG. 1) in the first direction, the first readout gradient magnetic field (a part of 31 in FIG. 1) in the third direction and the first phase encoding gradient magnetic field B (a part of 30 in FIG. 1) in the second direction; and a third step of applying the second readout gradient magnetic field (a part of 31 in FIG. 1) in the third direction while repeating polarity inversion at the same time as the second phase encoding gradient magnetic field B (a part of 30 in FIG. 1) in the second direction to read out nuclear magnetic resonance signals produced as the result of a polarity inversion of the second readout gradient magnetic field and is characterized in that a sequence, by which the first step to the third step are repeated desired times, is repeated while varying the phase encoding gradient magnetic field applied in the first direction to obtain three-dimensional images of the plurality of slices in the object to be inspected from the readout nuclear magnetic resonance signals.

Further, in measurement for grasping accurately variations in signal intensities such as brain functional imagings, it is characterized in that three-dimensional multi-slice measurements are effected after having determined the order of measurements of various slices so as to satisfy a predetermined condition.

Further, when a part of region of each of the left and right brains is measured, it is possible to make imaging (measuring) timing substantially equal for all the slices and variations in signal intensities of the brains exactly reflect on imaging of the slices by determining the order of measurements of the different slices so as to satisfy $N=(1+ne \times ns) \times ne/ns$ (where ne denotes the number of applications of the phase encoding gradient magnetic fields A for each of the slices; ns the number of slices; and N the sum of ordinal numbers representing the order of measurements).

The second object of the present invention can be achieved, in case where a plurality of slices are imaged continuously by multi-slice imaging in an inspection method by means of an inspection apparatus using NMR as explained above, by a method and an apparatus, in which a set of optimum shim currents is stored for every slice to be imaged; shim currents are switched over to optimum values for a specified slice prior to imaging; and then at imaging another slice shim currents are switched over to optimum values for that slice during imaging waiting time; or in case where spectroscopic measurements are effected for a plurality of local regions, by a method and an apparatus, in which a set of optimum shim currents is stored for every local region to be measured; shim currents are switched over to optimum values for a specified local region prior to imaging of that local region; and then at imaging another local region shim currents are switched over to optimum values for that local region during imaging waiting time.

In a prior art three-dimensional image measurement indicated in FIG. 2, a period of time from application of the excitation RF pulse 1 to the end of measurement of the nuclear magnetic resonance signal 6 is about 100 ms. However, when this operation is repeated while varying applied magnitude of the phase encoding gradient magnetic field 3, repetition time amounts even to several seconds, because a higher S/N of the image can be obtained, if magnetization recovery is waited for.

According to the present invention, nuclear magnetic resonance signals coming from other slices are measured during vacant time in the repetition time by a measurement method (echo-planar method, fast SE method, CPMG method, etc.) by which measurement time of the nuclear magnetic resonance signals is sufficiently short with respect to waiting time for magnetization recovery. For this reason it is possible to obtain three-dimensional images of a plurality of locations of interest (e.g. brain and abdomen, etc.) without elongating measurement time.

In the inspection method and the apparatus using NMR according to the present invention, in case where a plurality of slices are imaged continuously by multi-slice imaging, etc., it is unnecessary to take homogeneity of the static magnetic field into account for the whole plurality of slices, but only the homogeneity of the static magnetic field of smaller area may be taken into account for each of the slices. That is, by storing such optimum shim currents that the homogeneity of the static magnetic field is best for each of the slices and by switching over shim currents to the optimum values of the corresponding slice at imaging it, it is possible to effect imaging always under the static magnetic field of highest homogeneity.

Furthermore, in case where spectroscopic measurements of a plurality of local regions are effected, by storing such optimum shim currents that the homogeneity of the static magnetic field is best for each of the local regions and by switching over shim currents to the optimum values of the corresponding local region at imaging it, it is possible to effect spectroscopic measurements always under the static magnetic field of highest homogeneity.

As explained above, according to the present invention, it is possible to obtain three-dimensional images of a plurality of locations of interest without elongating measurement time, because nuclear magnetic resonance signals of other slices are measured during a period of time for waiting for magnetization recovery.

Still further it is possible to realize an inspection method and an apparatus using NMR suitable to multi-slice imaging or spectroscopic measurements of local regions and capable of improving the homogeneity of the static magnetic field. More concretely speaking, it is possible to achieve effects described below.

(1) In case where a plurality of slices are imaged continuously by multi-slice imaging, etc., since such optimum shim currents that the best static magnetic field distribution is obtained for each of the slices are stored and the shim currents are switched over to the optimum values directly before imaging each of the slices, it is possible to realize an inspection method and an apparatus using NMR capable of effecting imaging always under a static magnetic field of high homogeneity.

(2) In case where spectroscopic measurements are effected for a plurality of local regions, since such optimum shim currents that the best static magnetic field distribution is obtained for each of the local regions are stored and the shim currents are switched over to the optimum values directly before a spectroscopic measurement of each of the local regions, it is possible to realize an inspection method and an apparatus using NMR capable of effecting spectroscopic measurements always under a static magnetic field of high homogeneity.

In brief, according to the present invention, in order to obtain three-dimensional images of a plurality of locations of interest, measurements of nuclear magnetic resonance signals of the locations of interest are repeated while varying applied magnitude of the phase encoding gradient magnetic fields and the three-dimensional images of the plurality of locations of interest can be obtained in a measurement time for one slice without elongating the total measurement time by measuring nuclear magnetic resonance signals of other locations of interest in vacant time during the repetition time of these measurements for the relevant slice.

At this time, shim currents for improving the homogeneity of the static magnetic field are stored for each of the slices and multi-slice imaging is effected while switching over shim currents prior to imaging of each of the slices, corresponding to the relevant slice. Or shim currents for improving the homogeneity of the static magnetic field are stored for each of the local regions and spectroscopic measurements of a plurality of local regions are effected while switching over shim currents prior to imaging of each of the local regions, corresponding to the relevant local region.

DESCRIPTION OF THE PREFERRED EMBODIMENTS

Hereinbelow several preferred embodiments of the present invention will be explained, referring to the attached drawings.

Figure 4:
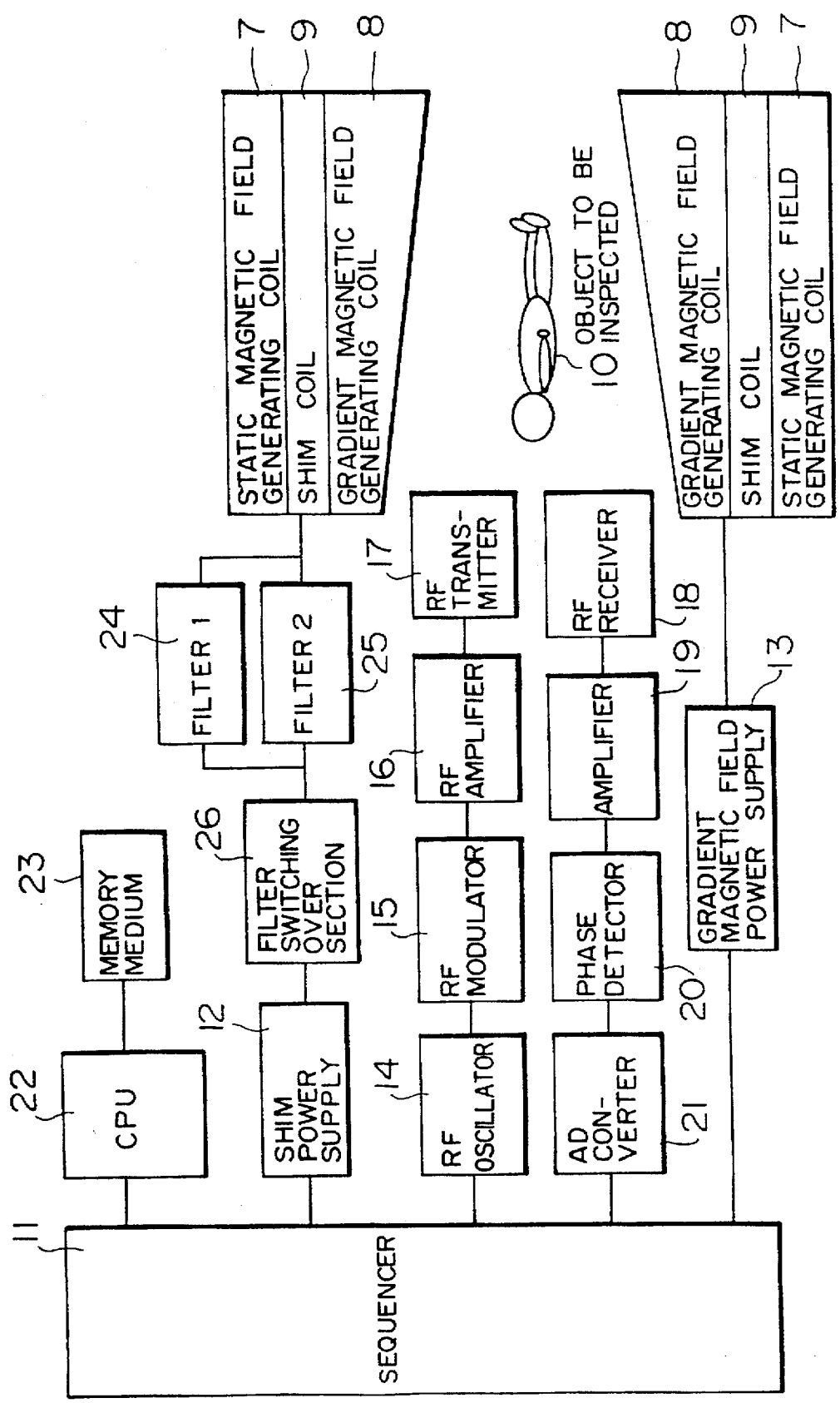
FIG. 4 is a block diagram indicating an example of construction of an apparatus, to which an inspection method (three-dimensional image measurement) using nuclear magnetic resonance according to the present invention is applied.

FIG. 4 is a block diagram indicating an example of construction of an apparatus, to which an inspection method (three-dimensional image measurement) using nuclear magnetic resonance according to the present invention is applied.

In FIG. 4, reference numeral 7 is a coil for generating the static magnetic field; 8 is coils for generating gradient magnetic fields in three directions, which are a first, a second and a third direction; 9 is shim coils for regulating the homogeneity of the static magnetic field; and 10 is an object to be inspected. This object to be inspected is surrounded by the coils 7, 8 and 9. A sequencer 11 sends commands to a shim power supply 12 to effect control by generating additional magnetic fields for correcting inhomogeneity of the static magnetic field by means of the coils 9. The coil 9 consists of a plurality of channels and current flowing through each of the coils is controlled by the sequencer 11 at regulating the homogeneity of the static magnetic field.

The sequencer 11 sends commands also to a gradient magnetic field power supply 13 and an RF oscillator 14 to control generation of the gradient magnetic fields and the RF magnetic field. The gradient magnetic fields are generated by the coils 8 for generating the gradient magnetic fields to add spatial information to signals generated by the object to be inspected. The RF magnetic field is applied to the object to be inspected 10 by an RF transmitter 17 through an RF modulator 15 and an RF amplifier 16. Nuclear magnetic resonance signals generated by the object to be inspected are received by a receiver 18 to be sent to a CPU 20, where they are subjected to signal processing, through an amplifier 19, a phase detector 20 and an AD converter 21. If necessary, it is possible also to store signals and measurement conditions in a memory medium 23. The shim power supply 12 includes low pass filters 24 and 25 having different time constants and a low pass filter is selected by a filter switching section 26, depending on utilization. A shim coil 9 is a double coil, which is constructed so as to obtain an active shield effect.

Now the pulse sequence used in the present embodiment will be described.

Since, according to the present invention, nuclear magnetic resonance signals from other slices are measured in waiting time for magnetization recovery, a greater effect can be obtained by a measurement method with decreasing measurement time sufficiently short for the nuclear magnetic resonance signals with respect to the waiting time. Pulse sequences, in case where the echo-planar method and the fast SE method are used as measurement methods having such a short measurement time, will be explained below.

First Embodiment

Figure 1:
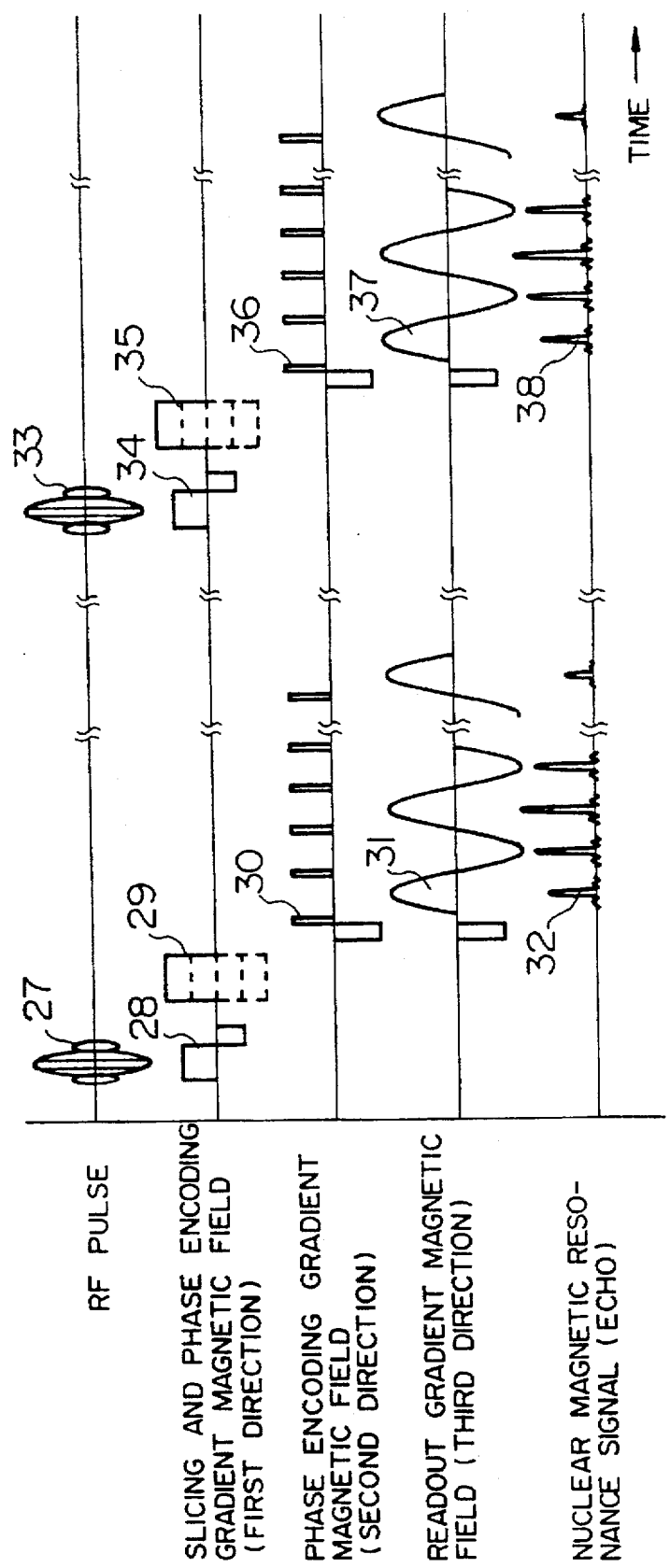
FIG. 1 is a diagram representing a pulse sequence for a three-dimensional image measurement, to which the echo-planar method is applied, which is a first embodiment of the present invention.
Figure 2:
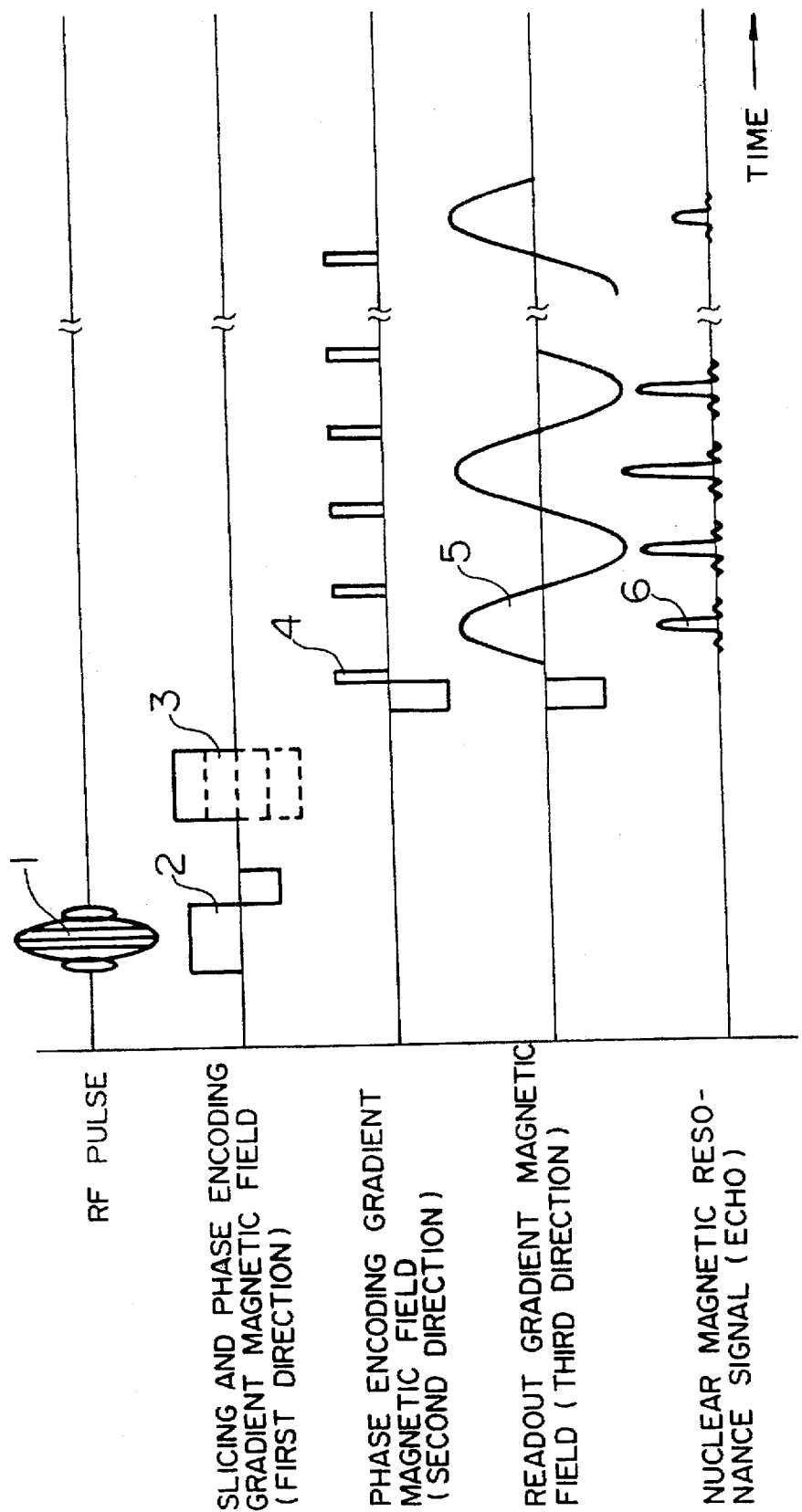
FIG. 2 is a diagram representing a pulse sequence for a three-dimensional image measurement, to which the prior art echo-planar method is applied.
Figure 3:
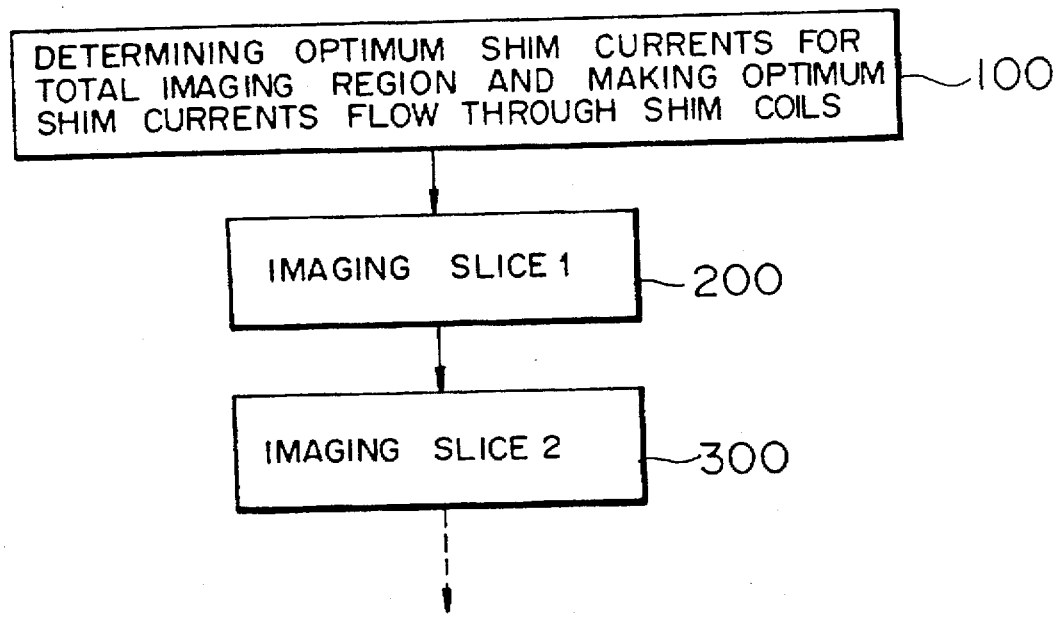
FIG. 3 is a diagram indicating a procedure for improving of the homogeneity of the static magnetic field and multi-slice imaging according to prior art techniques.

FIG. 1 is a diagram representing a pulse sequence for a three-dimensional image measurement, to which the echo-planar method is applied, which is the first embodiment of the present invention.

In FIG. 1, reference numerals 27 and 33 are excitation RF pulses; 28 and 34 are slicing gradient magnetic fields applied in the first direction; 29 and 35 are phase encoding gradient magnetic fields A applied in the first direction; 30 and 36 are phase encoding gradient magnetic fields B applied in the second direction; 31 and 37 are readout gradient magnetic fields applied in the third direction; and 32 and 38 are nuclear magnetic resonance signals.

In the present embodiment, the excitation RF pulse 27 is applied to the object to be inspected at the same time as the slicing gradient magnetic field 28 to excite a specified region Sa. Spatial information in the direction, in which the slicing gradient magnetic field 28 is applied, is added to the nuclear magnetic resonance signal 32 by applying subsequently the phase encoding gradient magnetic field A 29 in the same direction as that direction. Then the nuclear magnetic resonance signal 32 is read out by applying the readout gradient magnetic field 31 at the same time as the phase encoding gradient magnetic field B 30. The nuclear magnetic resonance signal 32 consists of a plurality of echo signals and each of the echos has a peak when the integral of the readout gradient magnetic field 31 is zero.

At this time, since each of the echos contains spatial information of the application direction of the readout gradient magnetic field 31 and further applied magnitude of the phase encoding gradient magnetic field B 30 is different for different echos, a plurality of echos containing different spatial information for application direction of the phase encoding gradient magnetic field B 30 are measured.

A period of time necessary for this procedure is usually 50 to 100 ms. In order to obtain information necessary for forming a three-dimensional image, this procedure is repeated desired times while varying applied magnitude of the phase encoding gradient magnetic field A 29. Since there is a margin of about 400 ms, supposing that this repetition time is e.g. 500 ms, similar measurements can be effected also for other slices in this time.

That is, another specified region Sb different from Sa is excited by applying the excitation RF pulse 33 to the object to be inspected at the same time as the slicing gradient magnetic field 34. Spatial information in the direction, in which the slicing gradient magnetic field 34 is applied, is added to the nuclear magnetic resonance signal 38 by applying subsequently the phase encoding gradient magnetic field A 35 in the same direction. Next the nuclear magnetic resonance signal 38 is read out by applying thereto the readout gradient magnetic field 37 at the same as the phase encoding gradient magnetic field B 36.

Thereafter it is repeated desired times to measure the nuclear magnetic resonance signals from the regions Sa and Sb while varying applied magnitude of the phase encoding gradient magnetic fields A 29 and 35 to obtain three-dimensional images of the regions Sa and Sb by subjecting respective nuclear magnetic resonance signals to three-dimensional Fourier transformation.

In the above procedure, switching over of the excited slice can be effected easily by varying frequency of the excitation RF pulse or intensity of the slicing gradient magnetic field. In case where the intensity of the slicing gradient magnetic field is constant, the interval between a slice S1 and another slice S0 passing through the origin of the gradient magnetic fields, is proportional to a difference between frequencies for S1 and S0. Further, since the interval is proportional also to the intensity of the slicing gradient magnetic field, switching over of the excited slice can be effected by varying the intensity of the gradient magnetic field, fixing the excitation frequency.

However, in this case, since the thickness of the slice varies, too, it is necessary to vary the pulse width of the excitation RF pulse. Since the thickness of the slice is inversely proportional to the intensity of the slicing gradient magnetic field and the pulse width of the excitation RF pulse, in case where the excited slice is switched over e.g. by decreasing the intensity of the slicing gradient magnetic field, it is sufficient to increase the pulse width of the excitation RF pulse.

Although multi-slice measurements by three-dimensional measurement of two slices are described in the present embodiment, if there is a margin in the repetition time, it is possible also to apply it to three-dimensional measurement for more than two slices.

Second Embodiment

Figure 5:
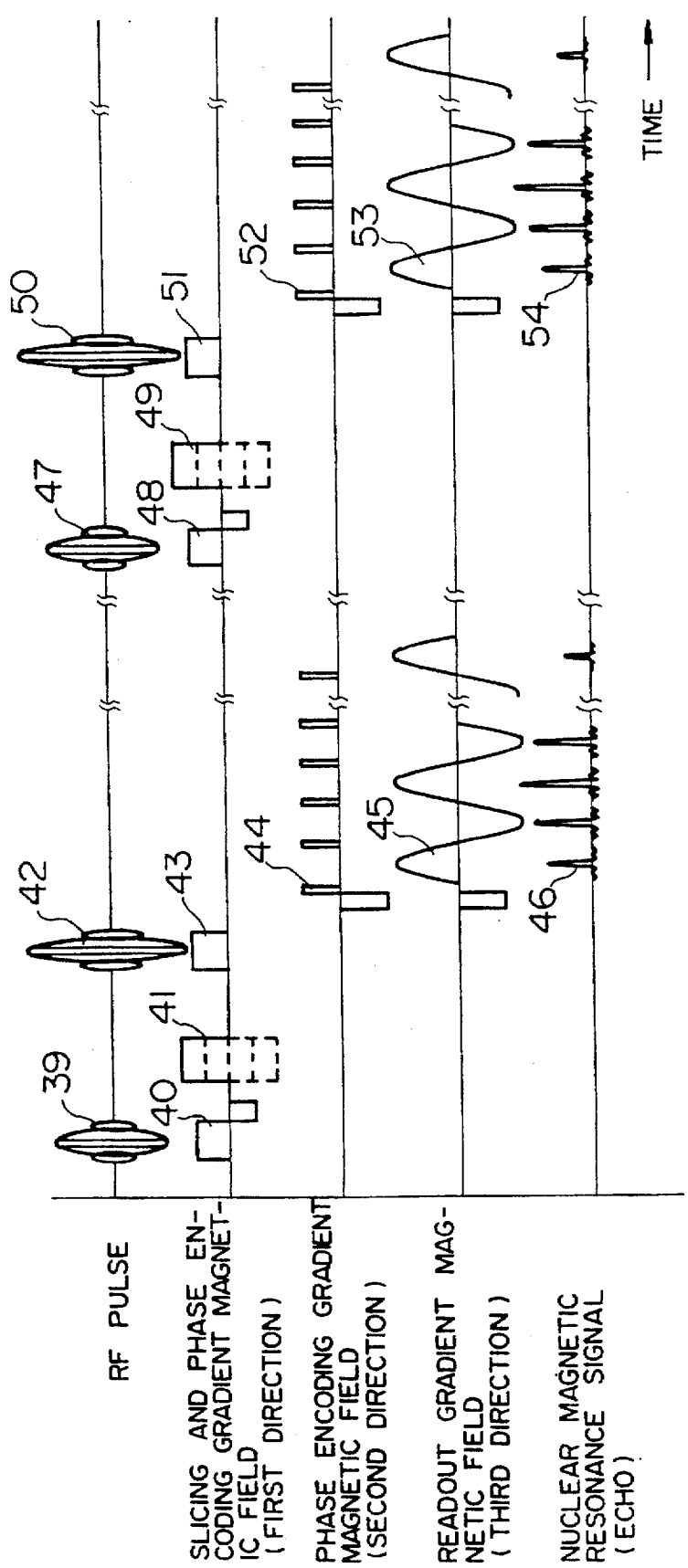
FIG. 5 is a diagram representing a pulse sequence for a three-dimensional image measurement, to which the echo-planar method is applied, which is a second embodiment of the present invention.

FIG. 5 is a diagram representing a pulse sequence for a three-dimensional image measurement, to which the echo-planar method is applied, which is the second embodiment of the present invention.

In FIG. 5, reference numerals 39 and 47 are excitation RF pulses; 40 and 48 are slicing gradient magnetic fields applied in the first direction; 41 and 49 are phase encoding gradient magnetic fields A applied in the first direction; 42 and 50 are inverting RF pulses; 43 and 51 are phase encoding gradient magnetic fields applied in the first direction; 44 and 52 are phase encoding gradient magnetic fields B applied in the second direction; 45 and 53 are readout gradient magnetic fields applied in the third direction; and 46 and 54 are nuclear magnetic resonance signals.

In the present embodiment, the excitation RF pulse 39 is applied to the object to be inspected at the same time as the slicing gradient magnetic field 40 to excite a specified region Sa. Spatial information in the direction, in which the slicing gradient magnetic field 40 is applied, is added to the nuclear magnetic resonance signal 46 by applying subsequently the phase encoding gradient magnetic field A 41 in the same direction.

Then the inverting RF pulse 42 is applied thereto at the same time as the slicing gradient magnetic field 43. The nuclear magnetic resonance signal 46 is read out by applying the readout gradient magnetic field 45 at the same time as the phase encoding gradient magnetic field B 44. The nuclear magnetic resonance signal 46 consists of a plurality of echo signals and each of the echos has a peak when the integral of the readout gradient magnetic field 45 is zero.

At this time, since each of the echos contains spatial information of the application direction of the readout gradient magnetic field 45 and further applied magnitude of the phase encoding gradient magnetic field B 44 is different for different echos, a plurality of echos containing different spatial information for application direction of the phase encoding gradient magnetic field B 44 are measured.

The phase encoding gradient magnetic field A 41 may be applied after application of the inverting RF pulse 42.

A period of time necessary for this procedure is usually 100 ms. In order to obtain information necessary for forming a three-dimensional image, this procedure is repeated desired times while varying applied magnitude of the phase encoding gradient magnetic fields A 41. Since there is a margin of about 400 ms, supposing that this repetition time is e.g. 500 ms, similar measurements can be effected also for other slices in this time.

That is, another specified region Sb different from Sa is excited by applying the excitation RF pulse 47 to the object to be inspected at the same time as the slicing gradient magnetic field 48. Spatial information in the direction, in which the slicing gradient magnetic field 48 are applied, is added to the nuclear magnetic resonance signal 54 by applying subsequently the phase encoding gradient magnetic field A 49 in the same direction.

Next the inverting RF pulse 50 is applied at the same time as the slicing gradient magnetic field 51 to invert magnetization of the region Sa. The nuclear magnetic resonance signal 54 is read out by applying thereto the readout gradient magnetic field 53 at the same as the phase encoding gradient magnetic field B 52.

Also in this case, the phase encoding gradient magnetic field A 49 may be applied after application of the inverting RF pulse 50.

Thereafter it is repeated desired times to measure the nuclear magnetic resonance signals from the regions Sa and Sb while varying applied magnitude of the phase encoding gradient magnetic fields A 41 and 49 to obtain three-dimensional images of the regions Sa and Sb by subjecting respective nuclear magnetic resonance signals to three-dimensional Fourier transformation.

In the above procedure, switching over of the excited slice can be effected easily by varying frequency of the excitation RF pulse or intensity of the slicing gradient magnetic fields. Similarly the slice, for which magnetization should be inverted, can be switched over by varying frequency of the inverting RF pulse or intensity of the slicing gradient magnetic fields.

Although multi-slice measurements by three-dimensional measurement of two slices are described in the present embodiment, if there is a margin in the repetition time, it is possible also to apply it to three-dimensional measurement for more than two slices.

Third Embodiment

Figure 6:
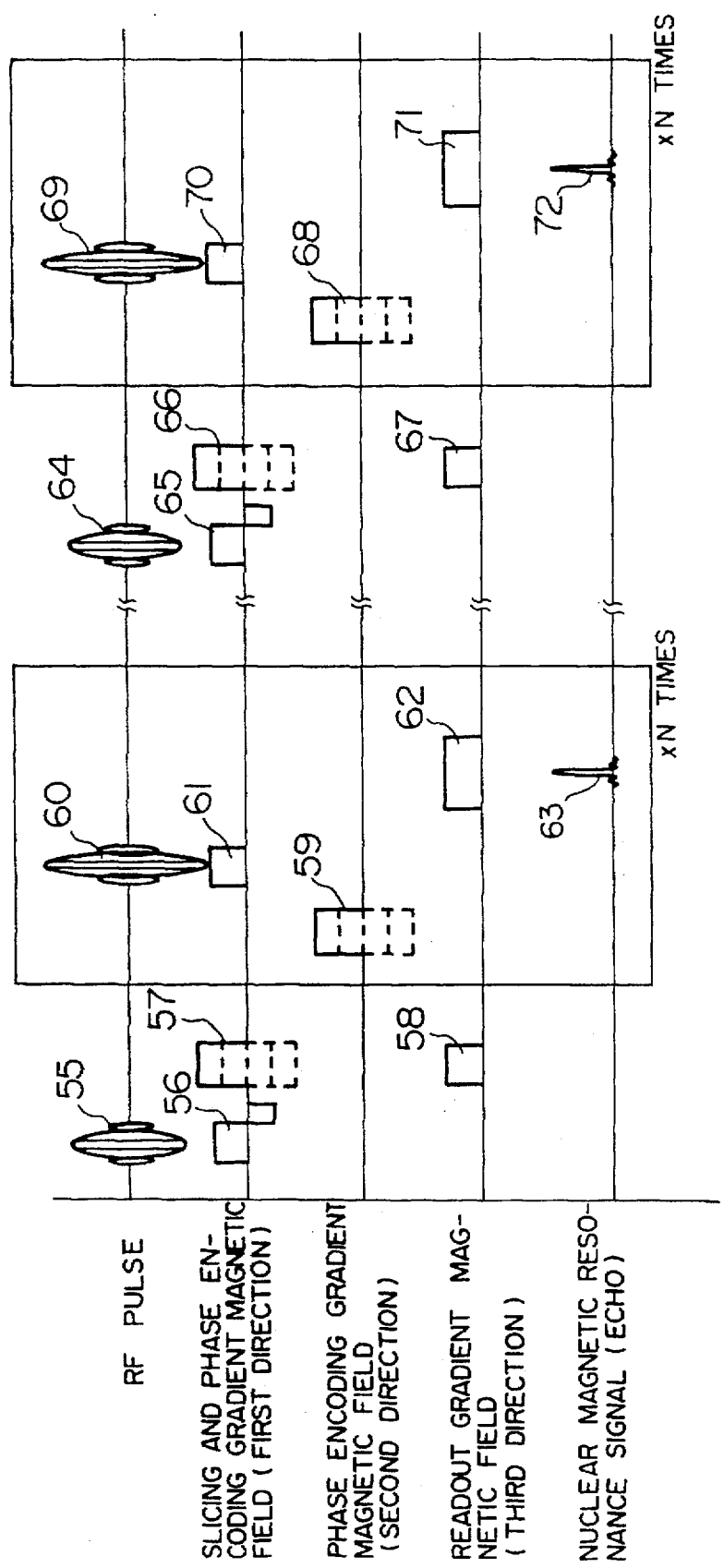
FIG. 6 is a diagram representing a pulse sequence for a three-dimensional image measurement, to which the fast SE method is applied, which is a third embodiment of the present invention.

FIG. 6 is a diagram representing a pulse sequence for a three-dimensional image measurement, to which the fast SE method is applied, which is the third embodiment of the present invention.

In FIG. 6, reference numerals 55 and 64 are excitation RF pulses; 56 and 65 are slicing gradient magnetic fields applied in the first direction; 57 and 66 are phase encoding gradient magnetic fields A applied in the first direction; 58 and 67 are readout gradient magnetic fields A applied in the third direction; 59 and 68 are phase encoding gradient magnetic fields B applied in the second direction; 60 and 69 are inverting RF pulses; 61 and 70 are slicing gradient magnetic fields applied in the first direction; 62 and 71 are readout gradient magnetic fields B applied in the third direction; and 63 and 72 are nuclear magnetic resonance signals.

In the present embodiment, the excitation RF pulse 55 is applied to the object to be inspected at the same time as the slicing gradient magnetic field 56 to excite a specified region Sa. Spatial information in the directions, in which the slicing gradient magnetic field 56 are applied, is added to the nuclear magnetic resonance signal 63 by applying subsequently the phase encoding gradient magnetic field A 57 in the same direction.

Then a procedure in (1) to (3) described below is repeated desired times.

(1) The phase encoding gradient magnetic field B 59 is applied.

(2) The inverting RF pulse 60 is applied at the same time as the slicing gradient magnetic field 61 to invert magnetization of the region Sa.

(3) The nuclear magnetic resonance signal 63 is read out by applying the readout gradient magnetic field B 62. The nuclear magnetic resonance signal 63 has a peak, when the integral of the readout gradient magnetic field is zero, and contains spatial information of the application direction of the gradient magnetic field.

At repeating the procedure described in (1) to (3), since applied magnitude of the phase encoding gradient magnetic field B 59 is varied, a plurality of nuclear magnetic resonance signals containing different spatial information for the application direction of the phase encoding gradient magnetic field B 59 are measured. The phase encoding gradient magnetic field 59 may be applied after application of the inverting RF pulse 60.

Figure 7:
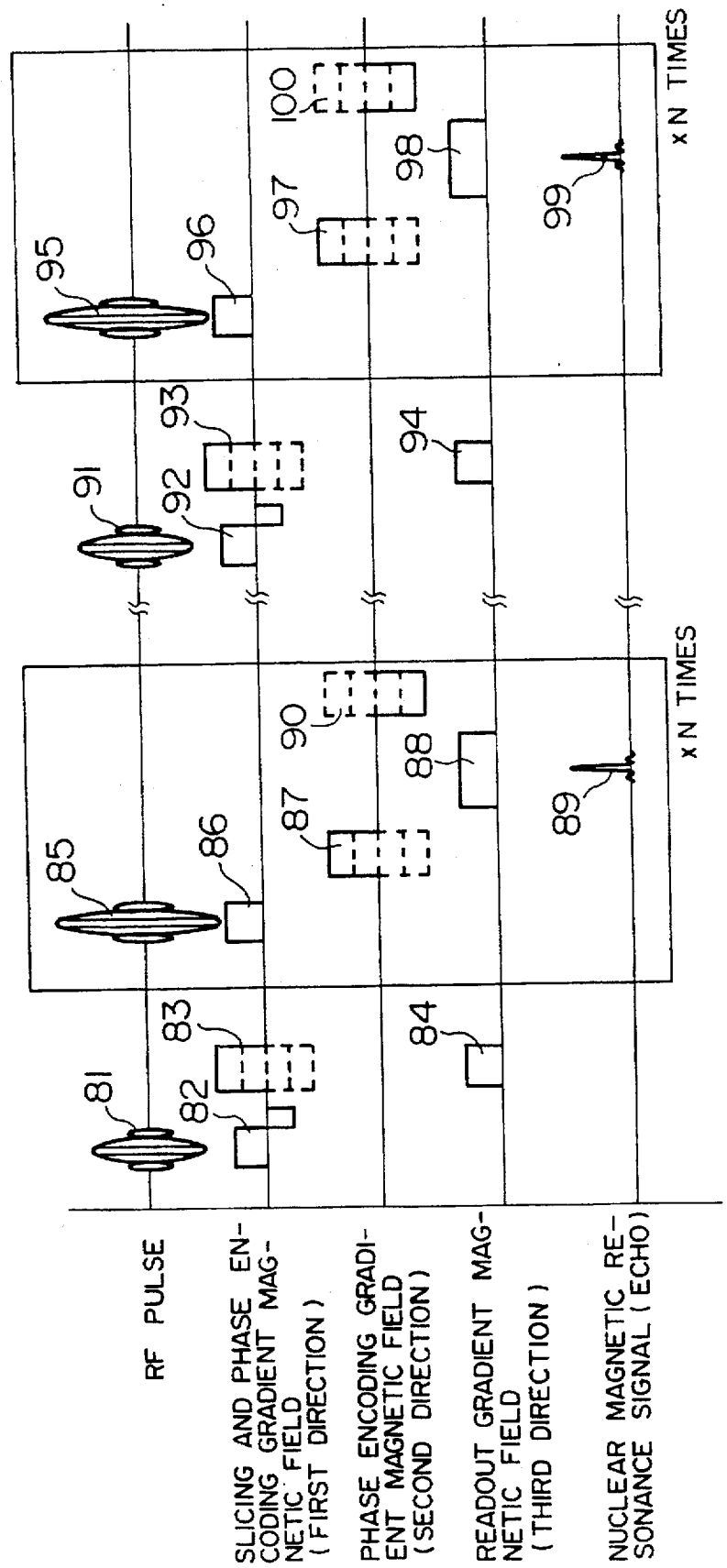
FIG. 7 is a diagram representing a pulse sequence for a three-dimensional image measurement, in which the CPMG method is applied to the third embodiment of the present invention.

Now FIG. 7 is a diagram representing a pulse sequence, in which the CPGM method is applied to the present embodiment. In FIG. 7, reference numerals 87 and 97 are phase encoding magnetic fields B1 applied in the second direction (corresponding to 59 and 68 in FIG. 6); 90 and 100 are phase encoding magnetic fields B2 applied in the second direction; 81 and 91 are excitation RF pulses (corresponding to 55 and 64 in FIG. 6); 82 and 92 are slicing gradient magnetic fields (corresponding to 56 and 65 in FIG. 6); 83 and 93 are phase encoding gradient magnetic fields A applied in the first direction (corresponding to 57 and 66 in FIG. 6); 84 and 94 are readout gradient magnetic fields A applied in the third direction (corresponding to 58 and 67 in FIG. 6); 85 and 95 are inverting RF pulses (corresponding to 60 and 69 in FIG. 6); 86 and 96 are slicing gradient magnetic fields B applied in the first direction (corresponding to 61 and 70 in FIG. 6); 88 and 98 are readout gradient magnetic fields applied in the third direction (corresponding to 62 and 71 in FIG. 6); and 89 and 99 are nuclear magnetic resonance signals (corresponding to 63 and 72 in FIG. 6).

In order to achieve CPGM, it is necessary to keep the integral of all the phase encoding gradient magnetic fields applied in the second direction from the center of a certain inverting RF pulse to the center of the succeeding inverting RF pulse at zero. For this purpose the gradient magnetic field (phase encoding gradient magnetic field B2 90) having an absolute value equal to that of the phase encoding gradient magnetic field B1 87 (corresponding to 59 in FIG. 6) and an inverted polarity with respect to the latter may be applied after measurement of the nuclear magnetic resonance signal 89 (corresponding to 63 in FIG. 6), as indicated in FIG. 7.

A period of time necessary for the above procedure is usually about 50 to 200 ms, supposing that the procedure described in (1) to (3) is repeated e.g. eight times. In order to obtain information necessary for forming a three-dimensional image, this procedure is repeated desired times while varying applied magnitude of the phase encoding gradient magnetic field A 57 in FIG. 6. Since there is a margin of about 300 ms, supposing that this repetition time is e.g. 500 ms, similar measurements can be effected also for other slices in this time.

That is, another specified region Sb different from Sa is excited by applying the excitation RF pulse 64 to the object to be inspected at the same time as the slicing gradient magnetic field 65. Spatial information in the direction, in which the slicing gradient magnetic field 65 are applied, is added to the nuclear magnetic resonance signal 72 by applying subsequently the phase encoding gradient magnetic field A 66 in the same directions.

Further phase of magnetization in the region is made at random by applying thereto the readout gradient magnetic field A 67.

Then a procedure in (4) to (6) described below is repeated desired times.

(4) The phase encoding gradient magnetic field B 68 is applied.

(5) The inverting RF pulse 60 is applied at the same time as the slicing gradient magnetic field 70 to invert magnetization of the region Sa.

(6) The nuclear magnetic resonance signal 72 is read out by applying the readout gradient magnetic field B 71. The nuclear magnetic resonance signal 72 has a peak, when the integral of the readout gradient magnetic field is zero, and contains spatial information of the application direction of the gradient magnetic field.

At repeating the procedure described in (4) to (6), since applied magnitude of the phase encoding gradient magnetic field B 68 is varied, a plurality of nuclear magnetic resonance signals containing different spatial information for the application direction of the phase encoding gradient magnetic field B 68 are measured.

Also in this case, the phase encoding gradient magnetic field 68 may be applied after application of the inverting RF pulse 69.

Thereafter it is repeated desired times to measure nuclear magnetic resonance signals from the regions Sa and Sb while varying applied magnitude of the phase encoding gradient magnetic fields B 59 and 68 and three-dimensional images of the regions Sa and Sb can be obtained by subjecting the respective nuclear magnetic resonance signals to three-dimensional Fourier transformation.

In case where the CPMG method is applied to the procedure described in (4) to (6), the phase encoding gradient magnetic field B2 100 having an absolute value equal to that of the phase encoding gradient magnetic field B1 97 (corresponding to 68 in FIG. 6) and an inverted polarity with respect to the latter may be applied after measurement of the nuclear magnetic resonance signal 99 (corresponding to 72 in FIG. 6) from the region Sa, as indicated in FIG. 7.

In the above procedure, switching over of the excited slice can be effected easily by varying frequency of the excitation RF pulse or intensity of the slicing gradient magnetic fields similarly to the preceding embodiment.

Similarly the slice, for which magnetization inversion should be effected, can be switched over by varying frequency of the inverting excitation RF pulse or intensity of the slicing gradient magnetic fields. Although multi-slice measurements by three-dimensional measurement of two slices are described in the present embodiment, if there is a margin in the repetition time, it is possible also to apply it to three-dimensional measurement for more than two slices.

Furthermore, although the inverting RF pulse is accompanied by application of the slicing gradient magnetic fields and it is designed so as to act only on a specified region in the pulse sequences indicated in FIGS. 5 and 6, the slicing gradient magnetic fields may not be applied, when the excitation RF pulse is applied.

In this case, the inverting RF pulse may be a so-called hard pulse, which acts on a large region.

Fourth Embodiment

Here a case where an inspection of a head and an abdomen, e.g. brain and liver, is effected with the help of three-dimensional images by means of the apparatus indicated in FIG. 4 will be explained.

For measuring such portions distant from each other, according to prior art techniques, it is necessary to measure a region of about a half of the stature or to effect three-dimensional image measurements two times, dividing it into a region including the brain and another region including the liver. Therefore it is easily presumed that measurement time is tremendous.

Figure 8:
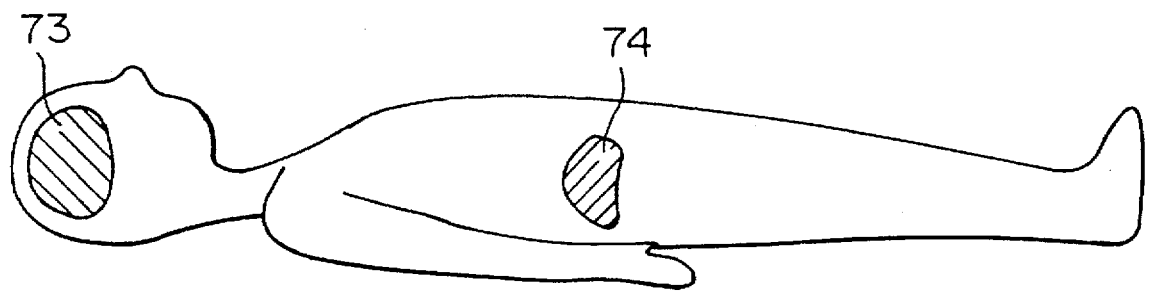
FIG. 8 is a diagram showing a region of a three-dimensional image measurement, which is a fourth embodiment of the present invention.
Figure 9:
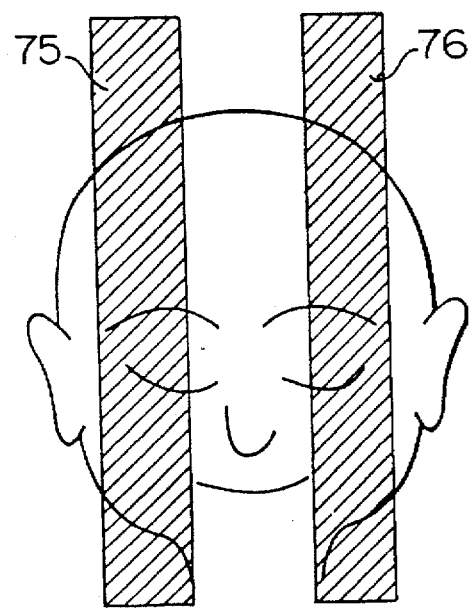
FIG. 9 is a diagram showing a region of a three-dimensional image measurement, which is a fifth embodiment of the present invention.

In this case, if images of two measurement regions as indicated in FIG. 8, region 73 (brain) and region 74 (liver), are measured simultaneously while effecting measurement of a slice in waiting time for magnetization recovery of another one, three dimensional images of a plurality of desired regions can be measured in a measurement time approximately as long as that required for measuring either one of them.

In a simultaneous measurement of the head and the abdomen, etc., the respective portions of interest have not always an approximately same volume. In such a case, in the pulse sequences indicated in FIGS. 1, 5 and 6, it is possible also to vary the magnitude of the measurement region for every slice by varying applied magnitude of the phase encoding gradient magnetic fields A (29, 35 in FIG. 1; 41, 49 in FIG. 5; and 57, 66 in FIG. 6) for one step.

The magnitude of the measurement region in a direction, in which a phase encoding gradient magnetic field is applied, is inversely proportional to applied magnitude of the phase encoding gradient magnetic field for one step. At this time it is possible also to vary magnitude of the excitation region or the magnetization inversion region, depending on the magnitude of the measurement region.

The excitation region becomes larger with decreasing pulse width of the excitation RF pulse (27, 33 in FIG. 1; 39, 47 in FIG. 5; and 55, 64 in FIG. 6) or decreasing applied magnitude of the slicing gradient magnetic field applied at the same time as the excitation RF pulse, while the excitation region becomes narrower with increasing pulse width or increasing applied magnitude.

Similarly the magnetization inversion region becomes larger with decreasing pulse width of the inverting RF pulse (42, 50 in FIG. 5; and 60, 69 in FIG. 6) or decreasing applied magnitude of the slicing gradient magnetic fields applied at the same time as the inverting RF pulse. On the contrary the magnetization inversion region becomes narrower with increasing pulse width of the inverting RF pulse or increasing applied magnitude.

Fifth Embodiment

In brain function measurement described e.g. in "Science, 254, pp. 716–719 (1991)", there is a case where responses of the right and the left brain are measured separately for a specified stimulus. In such a case, it is not necessary to measure the whole brain, but it is sufficient if images of regions of interest in the right and the left brain can be obtained. Three-dimensional images of desired regions can be obtained in a short time, if measurements of other slices are effected in a waiting time for magnetization recovery so that images of the region 75 (right brain) and the region 76 (left brain) are measured simultaneously.

In measurements, in which time variations of signals should be treated, such as.the brain function measurement, it is desired to determine order of measurements (imagings) of different slices so that timings of imaging (measurement) are approximately equal to each other for all the slices. In order to realize it, the order of measurements may be determined so that the sum (be N) of ordinal numbers (numerals representing the order such as 1st, 2nd, 3rd, . . . ) representing order of measurements is equal for all the slices. For this purpose N may satisfy a condition given by Eq. (1);

$$N=(1+ne \times ns) \times ne/ns \qquad (1)$$

where ns represents the number of slices and ne indicates the number of applications of the phase encoding gradient magnetic fields for each of slices.

When two slices A and B, e.g. A, B, B, A, A, B, B, A, A, B, B, A, . . . , etc. can be cited, as an example of the order of measurements satisfying the condition expressed by Eq. (1).

Sixth Embodiment

In case where ultra fast imaging or spectroscopic imaging is effected, it is desirable to regulate homogeneity of the static magnetic field prior thereto. Further, in case where images are measured by means of a magnetic resonance imaging apparatus, it is desirable to effect shimming for increasing homogeneity of the static magnetic field in order to improve image quality. For this reason, a usual magnetic resonance imaging apparatus includes static magnetic field generating coils for shimming called shim coils. These shim coils constitute a multi-channel coil system having various characteristics such as x, y, z, x2–y2, xy, z2, z3, . . . , etc. For example, x generates a magnetic field varying linearly with respect to x-axis and its rate of variation is approximately proportional to current intensity flowing through the coil (shim current). More homogeneous static magnetic field distribution can be obtained by superposing these additional static magnetic fields on the static magnetic field generated by the main coil. Therefore shimming means to obtain such a set of shim currents that they give the optimum static magnetic field distribution.

Now, in case where the object to be inspected has a complicated shape such as a human body, the static magnetic field distribution can vary only by about several ppm for different slices. In such a case, it is difficult to obtain a set of shim currents giving a good result over the whole measurement region.

Measurements can be effected always under the best static magnetic field distribution, if a set of shim currents is obtained so that the homogeneity of the static magnetic field is optimum for every slice and shim currents are switched over to such values that they give the optimum static magnetic field distribution for a specified slice, every time it is measured.

Hereinbelow explanation will be made, taking a case where multi-slice ultra fast imaging is effected by means of the inspection apparatus indicated in FIG. 4 as an example. For example, it is supposed that five slices disposed with an interval of 1 cm are imaged continuously.

Regulation of the homogeneity of the static magnetic field consists of steps as indicated below.

Step 1: Current—magnetic field characteristics (shim field characteristics) in a region to be regulated including an imaging region are examined for each of the shim coils. These shim field characteristics may be obtained either by calculation or by inserting a water sample, etc. into a space surrounded by the magnets and measuring variations in the static magnetic field distribution with respect to variations in shim currents for each of the channels.

Step 2: The static magnetic field distribution in the imaging region is measured. At this time it is desired to use a body to be examined, which should be imaged in reality, as an object to be measured.

Step 3: A set of such shim currents that they compensate the static magnetic field distribution obtained in Step 2, using the shim field characteristics for each of the channels obtained in Step 1 is found.

Step 4: Shim currents obtained in Step 3 are made flow through the shim coils.

Thereafter ultra fast imaging, etc. are effected under the improved static magnetic field distribution.

In case where five slices disposed with an interval of 1 cm are imaged continuously by multi-slice imaging, etc., the static magnetic field distribution can vary by about several ppm at the two ends of the region to be imaged.

Particularly, in case where the object to be imaged has a complicated shape such as a human body, this tendency is stronger. Consequently it is difficult to obtain such a set of shim currents that they realize a good static magnetic field distribution over the whole region to be imaged.

Figure 10:
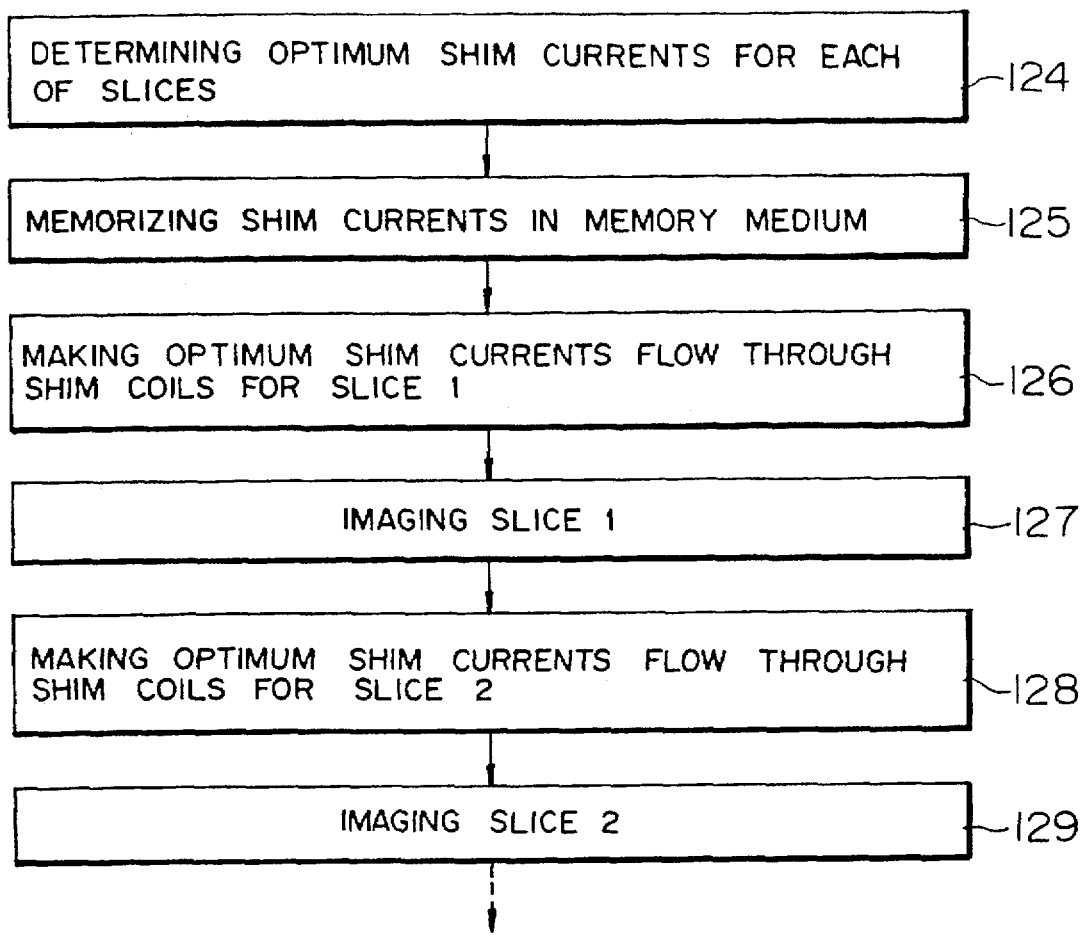
FIG. 10 is a diagram indicating a procedure for regulation of the homogeneity of the static magnetic field and multi-slice imaging according to a sixth embodiment.

Therefore, here, as indicated in Step 124 in FIG. 10, such a set of shim currents that they give the most homogeneous static magnetic field distribution is obtained for each of the slices to be imaged. That is, in the Step 1, shim field characteristics of the slices are obtained for the slices, for which the multi-slice imaging is effected; in the Step 2, the static magnetic field distribution is measured for each of the slices; and in the Step 3, such a set of shim currents that they give the best static magnetic field distribution is obtained for each of the slices.

Then, in Step 125, these shim currents for each of the slices are stored in current memory means and imaging is effected after having read out the shim currents corresponding to the slice to be imaged directly before the imaging to make them flow through the shim coils (Steps 126 and 127).

Subsequently, when another slice is imaged, imaging is effected after having switched over the shim currents directly before it (Steps 128 and 129).

According to the present embodiment, in case where a plurality of slices are imaged continuously by multi-slice imaging, etc., since the optimum values of shim currents giving the best static magnetic field distribution for each of the slices are stored and the shim currents are switched over to the optimum values directly before imaging of the respective slice, imaging can be effected always under a static magnetic field distribution of high homogeneity.

Figure 11:
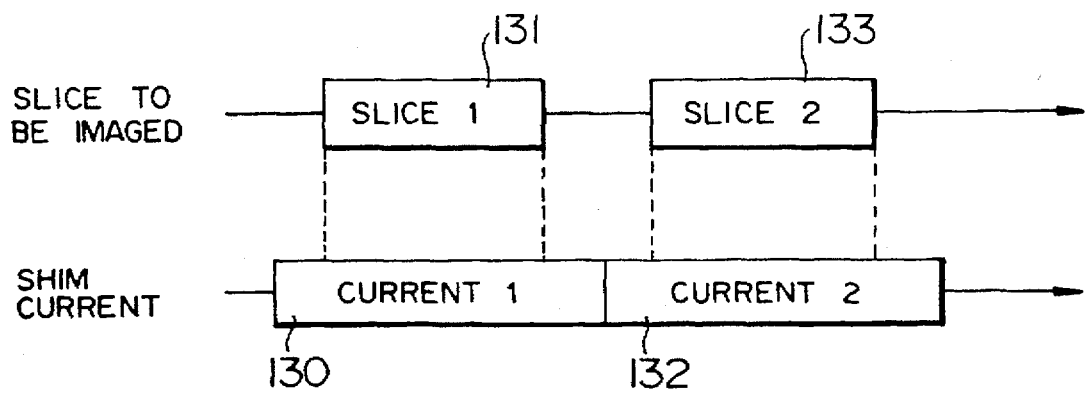
FIG. 11 is a diagram indicating a procedure for switching over shim current according to the sixth embodiment.

An example of timing of the multi-slice imaging and the switching over of the shim currents is indicated in FIG. 11. That is, Currents 1 corresponding to Slice 1 are made flow through the shim coils as initial values of the shim currents and imaging of Slice 1 is effected (Steps 130 and 131). Directly after the imaging of Slice 1, the shim currents are switched over to Currents 2 (Step 132).

Subsequently after a predetermined waiting time, imaging of Slice 2 is effected (Step 133).

Although an embodiment in case where multi-slice ultra fast imaging is effected has been described in the above explanation, also in case where spectroscopic measurements of a local region is effected, etc., the spectroscopic measurements can be effected under the best static magnetic field distribution for every region to be measured.

Figure 12:
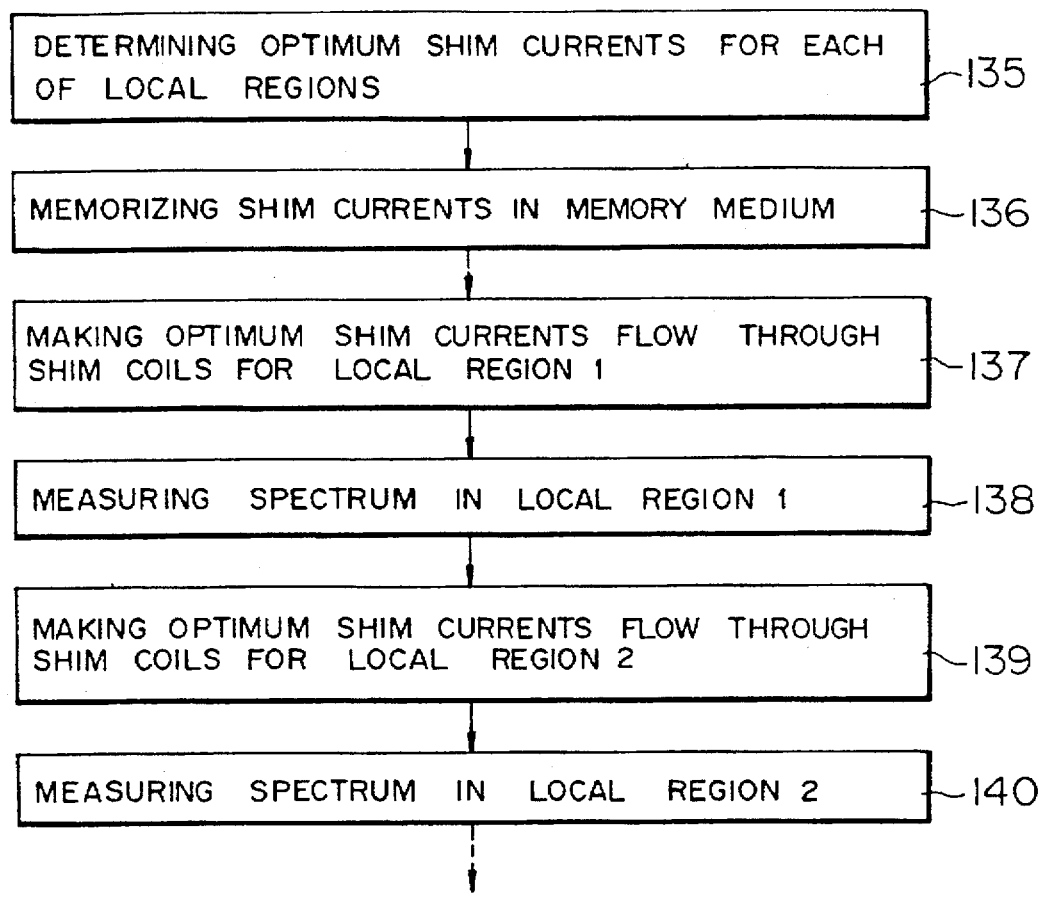
FIG. 12 is a diagram for explaining improving of the homogeneity of the static magnetic field and spectroscopic measurements according to the sixth embodiment.

That is, as indicated in Step 135 in FIG. 12, such a set of shim currents that they give the most homogeneous static magnetic field distribution is obtained for each of the local regions to be imaged. In the Step 1, shim field characteristics of the slices are obtained for the local regions, for which the spectroscopic measurements are effected; in the Step 2, the static magnetic field distribution is measured for each of the local regions; and in the Step 3, such a set of shim currents that they give the best static magnetic field distribution is obtained for each of the local regions.

These shim currents for each of the local regions are stored in current memory means (Step 136) and spectroscopic measurements are effected after having read out the shim currents corresponding to the local region to be imaged directly before the spectroscopic measurement to make them flow through the shim coils (Steps 137 and 138).

Subsequently, when another local region is imaged, spectroscopic measurements are effected after having switched over the shim currents directly before them (Steps 139 and 140).

Figure 13:
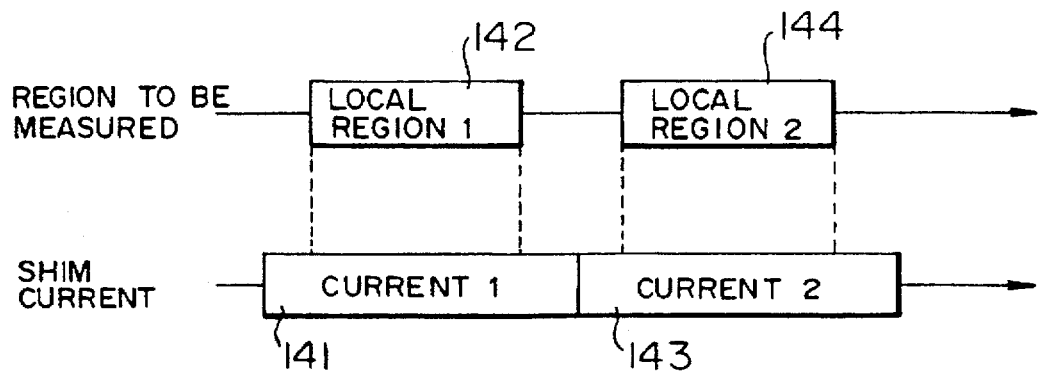
FIG. 13 is a diagram indicating a procedure for switching over shim current according to the sixth embodiment.

An example of timing of the spectroscopic measurements of local regions and the switching over of the shim currents is indicated in FIG. 13. That is, Currents 1 corresponding to Local Region 1 are made flow through the shim coils as initial values of the shim currents and spectroscopic measurements of Local Region 1 is effected (Steps 141 and 142). Directly after the spectroscopic measurements of Local Region 1, the shim currents are switched over to Currents 2 (Step 143). Subsequently after a predetermined waiting time, spectroscopic measurements of Local Region 2 are effected (Step 144).

The switching over of currents should be effected, every time the slice to be imaged or the region to be spectroscopically measured is changed. However it is inconvenient that the repetition time of imaging or spectroscopic measurements is elongated because of this switching time. In order to avoid such a situation, a plurality of low pass filters are disposed in the shim power supply 12 as indicated in FIG. 4 and the low pass filter to be used may be switched over by a filter switching over section 26, depending on utilization.

That is, at switching over the shim current, it may be switched to a low pass filter 24 (filter 1) having a time constant shorter than the waiting time of imaging or spectroscopic measurements, while at imaging or spectroscopic measurements, it may be switched to another low pass filter 25 (filter 2) having a long time constant in order not to worsen S/N.

The static magnetic field distribution in the Steps 1 and 2 is obtained, e.g. starting from phase distribution of nuclear magnetic resonance signals or resonance frequency distribution, using a water sample or a body to be examined.

In case where the static magnetic field distribution is obtained, starting from phase distribution of nuclear magnetic resonance signals, as described e.g. in J. Phys. E: Sci. Instrum., 18, pp. 224–227 (1985), an image of a water sample is photographed by using the pulse sequence indicated in FIG. 14.

In the figure, 145 is an excitation RF pulse; 146 is an inverting RF pulse; 147 is an echo signal; 148 and 149 are slicing gradient magnetic fields applied in a first direction; 150 is a phase encoding gradient magnetic field applied in a second direction; and 151 is a readout gradient magnetic field applied in a third direction.

Phase of nuclear magnetization excited by the excitation RF pulse 145 is made at random by inhomogeneity of the static magnetic field. However, since the phase is inverted at a moment where the inverting RF pulse 146 is applied, in case where the interval between the excitation RF pulse 145 and the inverting RF pulse 146 is in accordance with the interval between the inverting RF pulse 146 and the echo signal 147, influences of the inhomogeneity of the static magnetic field are completely compensated.

Figure 14:
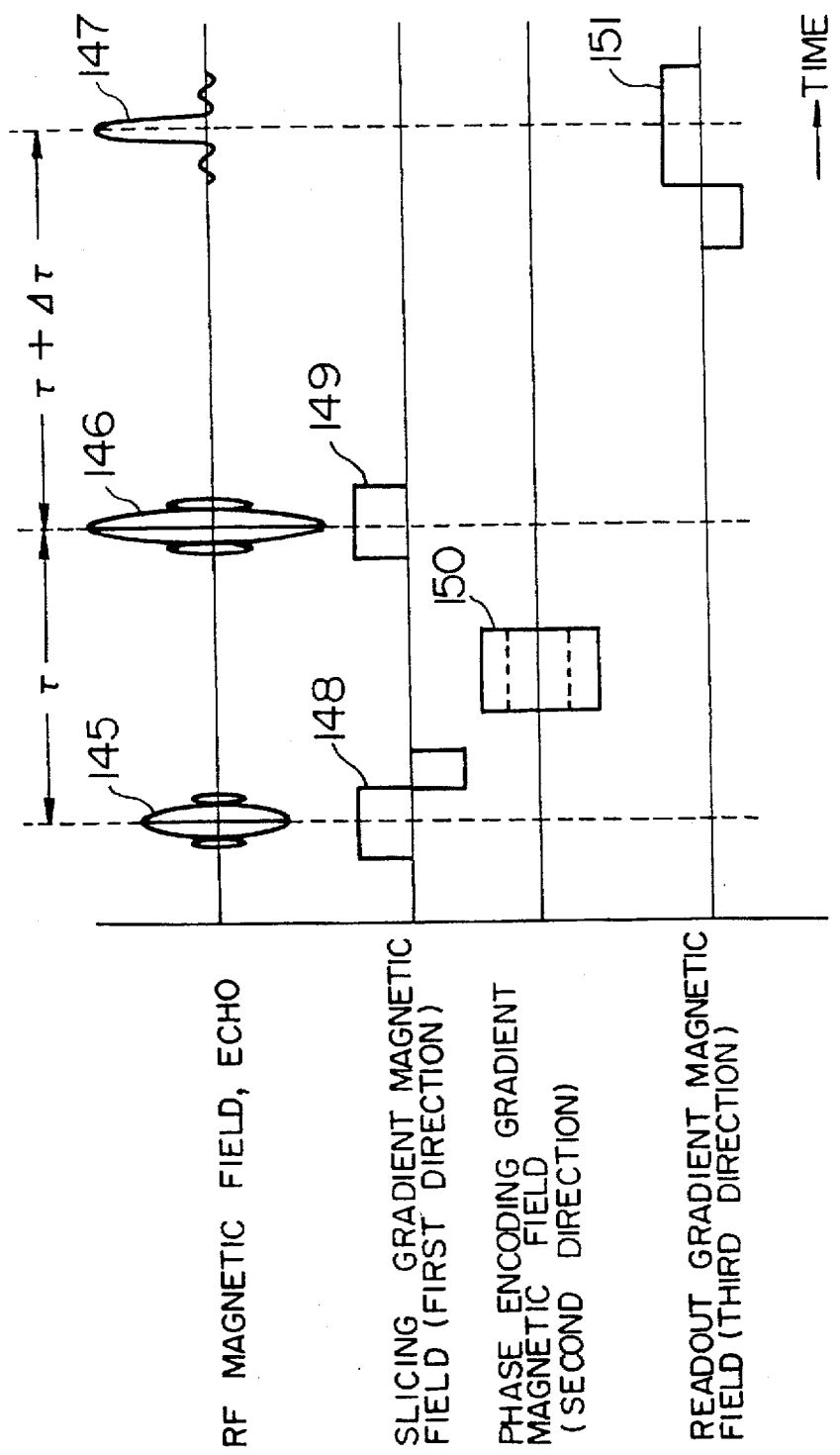
FIGS. 14 and 15 are diagrams indicating pulse sequences for static magnetic field measurements according to the sixth embodiment.

However, in FIG. 14, since echo signals including influences of the inhomogeneity of the static magnetic field are measured, the two intervals are set at $\tau$ and $\tau+\Delta\tau$, which are differed intentionally by $\Delta\tau$. At this time, since magnitude of the phase contained in the echo signals is proportional to the inhomogeneity of the static magnetic field and the difference $\Delta\tau$ between the two intervals, the static magnetic field distribution can be obtained, as indicated by the following Eq.(2):

$$\theta(x,y)=\gamma \cdot \Delta E(x,y) \cdot \Delta\tau \qquad (2)$$

where $\theta$ represents the phase (rad); $\Delta\tau$ the magnetic rotation ratio (rad/(T·sec)); $\Delta E$ the inhomogeneity of the static magnetic field (T (Tesler)) and $\Delta\tau$ the difference between the two intervals.

Figure 15:
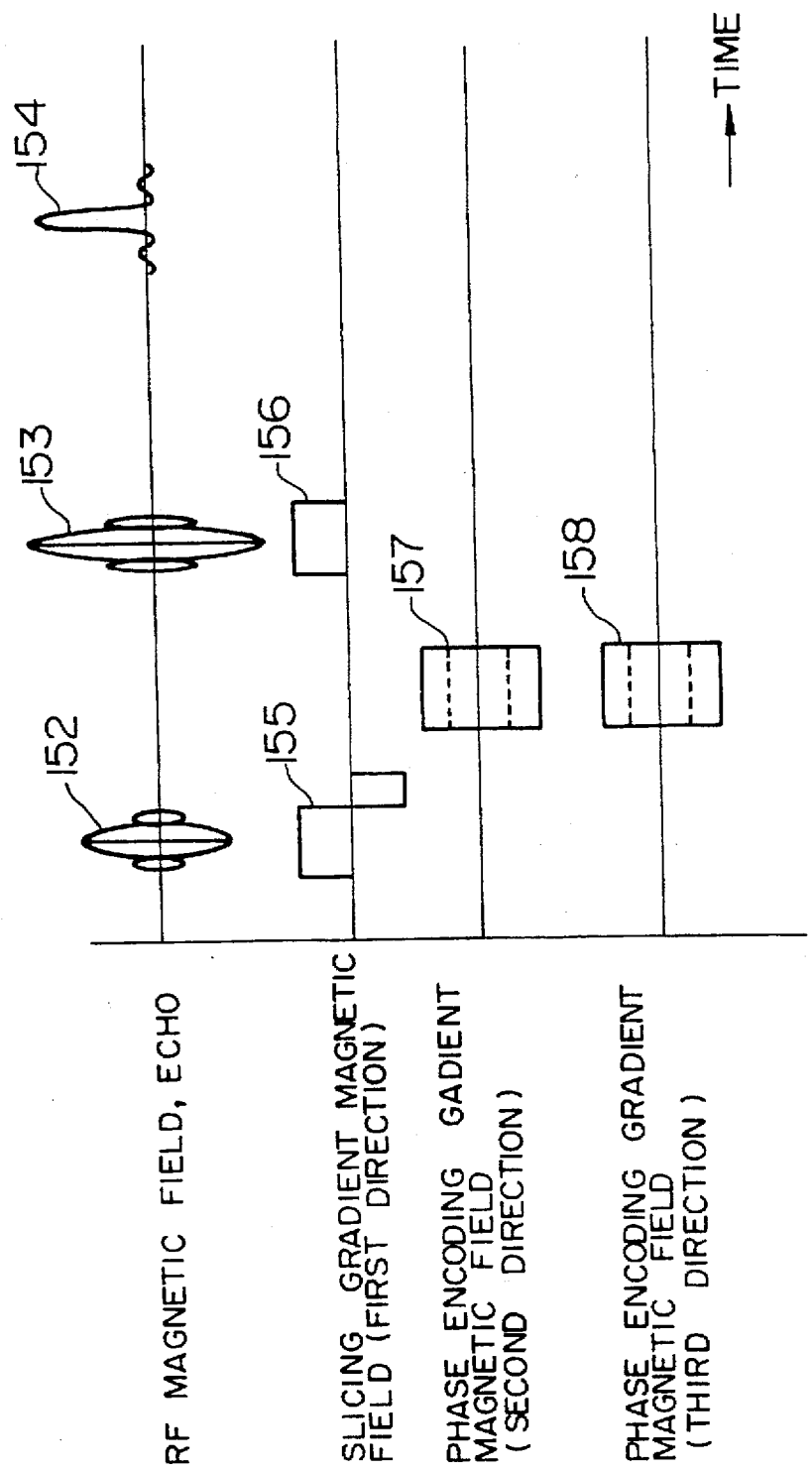

In case where the static magnetic field distribution is obtained, starting from resonance frequency distribution of nuclear magnetic resonance signals, as described e.g. in Journal of Magnetic Resonance, 85, pp. 244–254 (1989), an spectroscopic image of a homogeneous water sample, etc. is obtained by using the pulse sequence indicated in FIG. 15.

In FIG. 15, 152 is an excitation RF pulse; 153 is an inverting RF pulse; 154 is an echo signal; 155 and 156 are slicing gradient magnetic fields applied in a first direction; 157 and 158 are phase encoding gradient magnetic fields applied in a second and a third direction, respectively.

Resonance frequency of water is obtained for every pixel from the spectroscopic imaging. In case where an object to be measured is a homogeneous sample, the static magnetic field distribution can be obtained by utilizing the fact that displacement in the resonance frequency $\Delta f(x,y)$ is proportional to inhomogeneity of the static magnetic field, as indicated by Eq. (3):

$$\Delta f(x,y) \propto \Delta E(x,y) \qquad (3)$$

Regulation of the homogeneity of the static magnetic field can be effected also without measuring the static magnetic field distribution. For example a water sample, etc. are inserted into a space surrounded by the magnets and using a spectral peak or length of free induction decay (FID) of a specified slice or local region as an evaluation function, a set of shim currents may be determined so that the evaluation function is improved while varying the shim currents.

In this case, it is supposed that the static magnetic field distribution is most homogeneous, when the value of spectral peak is highest or the FID is longest.

Also in a case where regulation of the homogeneity of the static magnetic field is effected in this manner, imaging or spectroscopic measurements can be carried out under the best static magnetic field distribution by storing a set of optimum shim currents for every specified slice or local regions and by making the shim currents, which are optimum for the corresponding slice or local region, flow through the shim coils prior to imaging or spectroscopic measurements.

Now in the regulation of the homogeneity of the static magnetic field, since shim currents are switched over in the waiting time in imaging of a specified slice or spectroscopic measurements of a specified local region, there is a possibility that eddy current produced by variations in the magnetic fields generated by the shim coils worsens image or spectra.

However, in the inspection apparatus used in the embodiment indicated in FIG. 4, an active shield effect can be obtained, if the shim coils 9 are double coils, and in this way it is possible to prevent influences of such eddy current. Here active shield is a method, by which magnetic field generated by one part of an double shim coil in a conductor portion such as a magnet, a frame, etc. is compensated by the other part of the double coil. That is, it has a construction, in which no eddy current is produced, because no magnetic field is generated in the conductor portion.

For a prior art shim coil it was not supposed to vary current in the course of a sequence and thus no production of eddy current was supposed. Therefore the construction as described above was unnecessary.

On the contrary, by the inspection method according to the present invention, active shield is required, because it is necessary to switch over current, depending on the position of the respective slice.

On the active shield, refer to e.g. J. Phys. E: Sci. Instrum., 19, pp. 540–545 (1986), in which it is described in detail.

Figure 16:
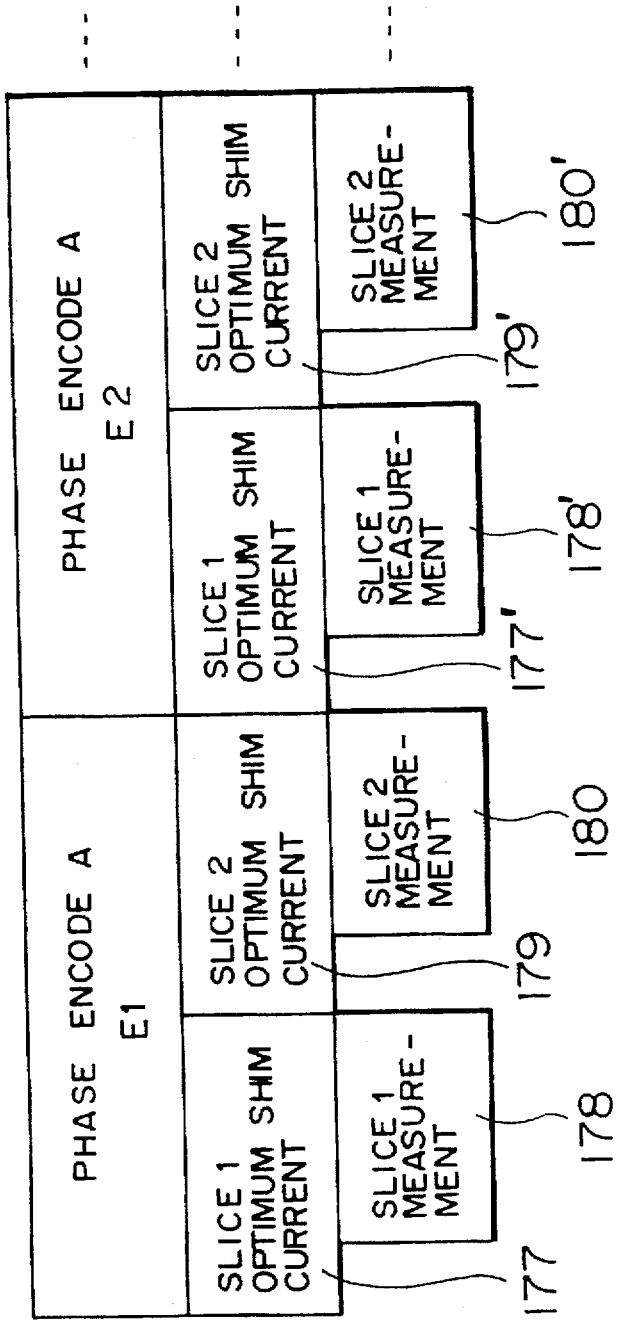
FIG. 16 is a diagram indicating a procedure for switching over shim current according to the sixth embodiment of the present invention.

When measurements are repeated while varying applied magnitude of the phase encoding magnetic fields A, using a pulse sequence indicated in FIGS. 1, 5 or 6, the shim currents are switched over according to a procedure as indicated in FIG. 16. This procedure will be explained below, taking a case where two slices are measured, as an example.

When the applied magnitude is E1, at first shim currents are switched over to the optimum values for Slice 1 (Step 177) and then Slice 1 is measured (Step 178). Next shim currents are switched over to the optimum values for Slice 2 (Step 179) and then Slice 2 is measured (Step 180). A similar operation is effected after having changed the applied magnitude to E2. That is, after having switched over the shim currents to the optimum values for Slice 1 (Step 177'), a measurement of Slice 1 is effected (Step 178'). Next after having switched over the shim currents to the optimum values for Slice 2 (Step 179'), a measurement of Slice 2 is effected (Step 180'). This operation is repeated, every time measurements of Slice 1 and Slice 2 are effected alternately while varying applied magnitude of the phase encoding magnetic fields A.

Since this switch over of the shim currents should be effected, every time the slice to be measured is changed, the time necessary for this switch over should be satisfactorily short. For example, in case where the repetition time is 500 ms, the measurement time for every encode is 100 ms and two slices are measured, the shim currents should be switched over two times in a vacant period of time of 300 ms.

Usually low pass filters having long time constants are used in the shim current power supply in order to prevent worsening of S/N and thus it is difficult to switch over the shim currents in 150 ms. In order to avoid such a situation, there are disposed a plurality of low pass filters (Filter 1), which may be switched over by a filter switching section 26, as indicated in FIG. 4, depending on field of use.

That is, they may be switched over to a low pass filter 24 having a time constant shorter (Filter 1) than the vacant time at switching over the shim currents, while they may be switched over to another low pass filter 25 having a long time constant (Filter 2) at measurements, in order not to worsen S/N.

It is a matter of course that these embodiments indicate only several examples of the present invention and the present invention is not restricted thereto.

We claim:

1. An inspection method for measuring a plurality of local regions, using nuclear magnetic resonance by means of an apparatus having magnetic field generating means for generating a static magnetic field, gradient magnetic fields and an RF magnetic field, magnetic field generating means including shim coils, which vary homogeneity of said static magnetic field by varying a shim current flowing therethrough, signal detecting means for detecting nuclear magnetic resonance signals from an object to be inspected, means for processing signals detected by said signal detecting means, and control means for controlling shim currents flowing through said shim coils, said inspection method comprising the steps of:

(a) obtaining optimum shim current values for improving the homogeneity of said static magnetic field for each of said plurality of local regions to be inspected, based on a measurement of a static magnetic field distribution within each of said plurality of local regions, prior to spectroscopic measurement of each of said plurality of local regions in said object to be inspected;

(b) storing said optimum shim current values for each of said plurality of local regions;

(c) making said shim current of said optimum shim current values flow through said shim coils for another local region to be measured subsequently, which is different from a local region already inspected, in a recovery time for longitudinal magnetization in spectroscopic measurements of said local region already inspected; and (d) effecting spectroscopic measurements of said another local region in said recovery time.

2. An inspection method according to claim 1, wherein the step of obtaining said optimum shim current values for each of a plurality of local regions to be inspected includes determining shim field characteristics for each of the shim coils and measuring the static magnetic field distribution within each of the plurality of local regions for said object to be inspected utilizing the shim field characteristics prior to spectroscopic measurements of the plurality of local regions for said object to be inspected so as to determine said optimum shim current values for each of the plurality of local regions to be inspected.

* * * * *